United States Patent [19]

Cotton

[11] Patent Number: 5,243,657
[45] Date of Patent: Sep. 7, 1993

[54] AUTOMATIC MICROPHONE SENSITIVITY CONTROL CIRCUIT

[76] Inventor: Brian Cotton, 5690 S. Canal St., Terre Haute, Ind. 47802

[21] Appl. No.: 922,735

[22] Filed: Jul. 31, 1992

[51] Int. Cl.$^5$ .............................................. H03G 3/20
[52] U.S. Cl. ....................................... 381/57; 381/107
[58] Field of Search ................. 381/57, 107, 108, 110

[56]     References Cited
         U.S. PATENT DOCUMENTS

| | | |
|---|---|---|
| 2,338,551 | 1/1944 | Stanko . |
| 2,392,218 | 1/1946 | Anderson . |
| 3,160,707 | 12/1964 | Meyers . |
| 3,296,373 | 1/1967 | Suganuma . |
| 3,409,738 | 11/1968 | Heald et al. . |
| 3,410,958 | 11/1968 | Cohen . |
| 4,101,843 | 7/1978 | Aoyama ............................. 330/280 |
| 4,254,303 | 3/1981 | Takizawa . |
| 4,453,264 | 6/1984 | Hochstein ........................... 381/110 |
| 4,521,738 | 6/1985 | Akagiri et al. ..................... 330/134 |
| 4,627,098 | 12/1986 | Dolikian et al. ...................... 455/70 |
| 4,691,307 | 9/1987 | Rambow ............................... 367/69 |
| 4,771,472 | 9/1988 | Williams, III et al. ............... 381/94 |
| 5,077,799 | 12/1991 | Cotton ................................... 381/57 |

*Primary Examiner*—Forester W. Isen
*Attorney, Agent, or Firm*—MacMillan, Sobanski & Todd

[57]     ABSTRACT

An electronic circuit for automatically adjusting the sensitivity of a microphone in accordance with changes in ambient noise is disclosed. A signal is generated which is proportional to the magnitude of the ambient noise and is applied through a reverse biased diode to slowly charge a capacitor by means of leakage current. The capacitor is connected to a control input of a sensitivity control circuit connected between the microphone and a device. The sensitivity control circuit is responsive to the signal from the capacitor voltage signal for controlling the sensitivity of the microphone relative to the device. Because the capacitor is discharged at a rate which is much faster than the rate at which it is charged, the circuit sensitivity is raised more quickly in response to a decrease in the magnitude of the ambient noise than it is lowered in response to an increase in the magnitude of such noise. A similar circuit is disclosed for use with a microphone threshold circuit.

6 Claims, 2 Drawing Sheets

AUTOMATIC MICROPHONE SENSITIVITY CONTROL CIRCUIT

CROSS REFERENCE TO RELATED PATENT

This application is related in subject matter to U.S. Pat. No. 5,077,799, issued Dec. 31, 1991.

BACKGROUND OF THE INVENTION

This invention relates in general to noise responsive devices and in particular to an electronic circuit for automatically adjusting the sensitivity to a microphone in response to the level of ambient noise.

Microphones are well known devices for converting acoustic energy into electrical energy. Microphones are widely used as audio input devices for many different types of electrical and electronic devices, such as aviation radios, vehicle telephones, audio and video tape recorders, and other communication and sound recording devices. A wide variety of microphone structures are known in the art for use with such devices.

Typically, a given microphone structure has a predetermined sensitivity characteristic. Generally speaking, this sensitivity characteristic is representative of the magnitude of the output electrical signal generated by the microphone in response to the input acoustic energy sensed thereby. Thus, a high sensitivity microphone can generate an electrical signal in response to relatively small amounts of acoustic energy. High sensitivity microphones are frequently used in situations where the undesirable ambient noise underlying a desired source is relatively small, such as in studio sound recordings. Conversely, a low sensitivity microphone can generate an electrical signal in response only to relatively high amounts of acoustic energy. Low sensitivity microphones are frequently used in situations where the undesirable ambient noise underlying a desired source is relatively large, such as in aviation radios.

In some situations, a microphone structure may be used in conjunction with an electronic switch which functions as a threshold adjustment circuit. The threshold switch can be controlled between an open mode (wherein the signal from the microphone is not passed therethrough) and a closed mode (wherein the signal from the microphone is passed therethrough). Such threshold switches are frequently provided where the microphone is used in an environment having a relatively high amount of ambient noise. In use, the threshold switch is normally operated in the opened mode until a threshold level of acoustic energy (typically somewhat higher than the level of the ambient noise) is sensed. At that point, the threshold switch is operated in the closed mode, allowing the signal to be passed therethrough.

As mentioned above, a given microphone structure has a predetermined sensitivity characteristic. Therefore, a microphone which is designed for use in a certain situation may not be suitable for use in a different situation. Furthermore, some microphones may be used in situations where the undesirable ambient noise underlying a desired source changes during use. For example, the level of ambient noise underlying the use of a vehicle telephone may change dramatically, depending upon the speed of the car, whether the windows of the vehicle are open or closed, and many other factors. Although manual and automatic microphone sensitivity control circuits are known in the art, such circuits are typically complicated and expensive. Similarly, manual and automatic microphone threshold control circuits are also typically complicated and expensive. Thus, it would be desirable to provide an automatic microphone sensitivity control circuit and an automatic microphone threshold control circuit which are simple and inexpensive in construction and operation.

SUMMARY OF THE INVENTION

This invention relates to a simple and inexpensive electronic circuit for automatically adjusting the sensitivity of a microphone in accordance with changes in the magnitude of ambient noise. A voltage signal is generated which is proportional to the magnitude of the ambient noise. The voltage signal is applied through a reverse biased diode to slowly charge a capacitor by means of leakage current through the diode. The capacitor is connected to a control input of a sensitivity control circuit connected between the microphone and a device. The sensitivity control circuit is responsive to the signal from the capacitor voltage signal for controlling the sensitivity of the microphone relative to the device. When the magnitude of the ambient noise increases, the capacitor will be slowly charged so as to slowly decrease the sensitivity of the microphone relative to the device. When the magnitude of such ambient noise decreases, the capacitor will be rapidly discharged so as to rapidly increase the circuit sensitivity. Because the capacitor is discharged at a rate which is much faster than the rate at which it is charged, the circuit sensitivity is raised more quickly in response to a decrease in the magnitude of the ambient noise than it is lowered in response to an increase in the magnitude of such noise. A similar circuit is disclosed for use with a microphone threshold circuit.

Various objects and advantages of this invention will become apparent to those skilled in the art from the following detailed description of the preferred embodiments, when read in light of the accompanying drawings.

DETAILED DESCRIPTION OF THE PREFERRED EMBODIMENTS

Figure 1:
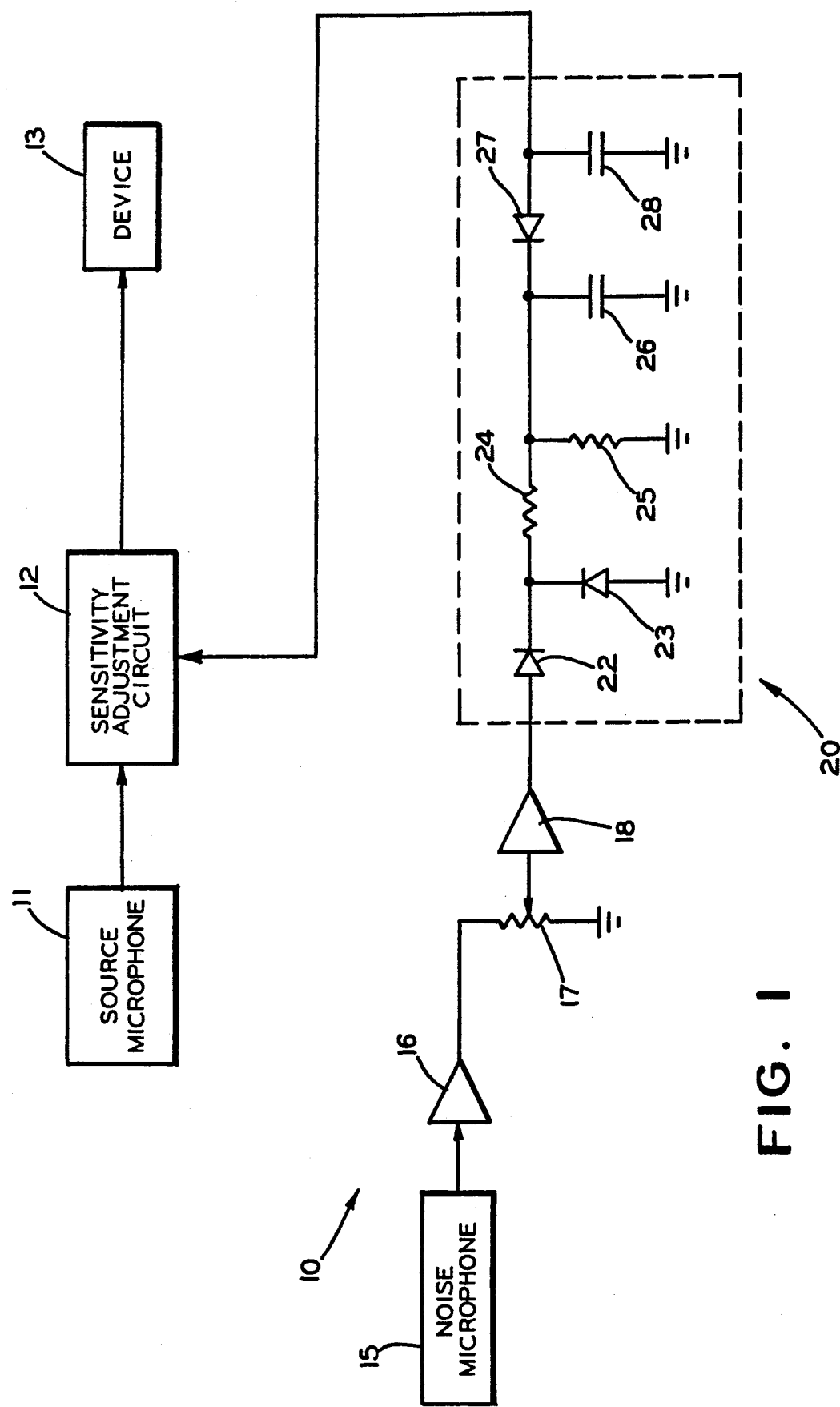
FIG. 1 is a schematic diagram illustrating an automatic microphone sensitivity control circuit in accordance with this invention.

Referring now to the drawings, there is illustrated in FIG. 1 a schematic diagram illustrating an automatic microphone sensitivity control circuit, indicated generally at 10, in accordance with this invention. The circuit 10 includes a conventional source microphone 11 which, as is well known, generates an analog electrical signal which is proportional to the magnitude of the source, such as a person's voice. The source microphone 11 is connected through a sensitivity adjustment circuit 12 to a source responsive device 13. The sensitivity adjustment circuit 12 is conventional in the art and is responsive to a sensitivity adjustment signal (described below) for adjusting the sensitivity of the source microphone 11 relative to the device 13. The device 13 may be any conventional device which is typically used with an electronic signal from the microphone, such as an aircraft radio or a vehicle telephone.

The circuit 10 further includes means for generating the sensitivity adjustment signal for the sensitivity adjustment device 12. This means includes a noise microphone 15 which, as with the source microphone 11, generates an analog electrical signal which is proportional to the magnitude of the ambient noise. For reasons which will be explained below, the noise microphone 15 is preferably an ultrasonic microphone, which detects only those sounds which are at frequencies above the normal hearing range. The noise microphone 15 is located in the environment of the source microphone 11 so as to sense the amount of ambient noise. For example, the noise microphone 15 may be located in the interior of an aircraft or automobile.

The output signal from the noise microphone 15 is fed through a first amplifier 16 and a potentiometer 17 to a second amplifier 18. The first amplifier 16 increases the magnitude of the signal from the noise microphone 15. The potentiometer 17 provides a means for adjusting the sensitivity of the circuit 10. The second amplifier 18 further increases the magnitude of the signal from the potentiometer 17.

The output from the second amplifier 18 is fed to input of a control circuit, indicated generally at 20. The input of the control circuit 20 is an anode of a diode 22. The cathode of the diode 22 is connected to the junction of the cathode of a diode 23 and a resistor 24. The anode of the diode 23 is connected to ground potential. The diode 22 and the diode 23 function to double and rectify the voltage of the signal from the second amplifier 15. The resistor 24 is connected to the junction of a resistor 25, a capacitor 26, and the cathode of a diode 27. The resistor 25 and the capacitor 26 are connected in parallel to ground potential and, together with the resistor 24, function as a filter for the rectified signal from the diode 22. Thus, the electrical signal present at the junction of the resistor 25, the capacitor 26, and the cathode of the diode 27 is a positive voltage having a magnitude which is proportional to the magnitude of the ambient noise sensed by the noise microphone 15.

The anode of the diode 27 is connected though a capacitor 28 to ground potential. The anode of the diode 27 is also connected to the control input of the sensitivity adjustment circuit 12. Thus, the voltage on the capacitor 28 represents the sensitivity adjustment signal which is applied to the sensitivity adjustment circuit 12. The magnitude of this sensitivity adjustment signal, therefore, adjusts the sensitivity of the source microphone 11 relative to the device 13. When the voltage across the capacitor 28 is increased, the sensitivity adjustment signal is increased, thus causing the sensitivity adjustment circuit 12 to decrease the sensitivity of the source microphone 11 relative to the device 13. When the voltage across the capacitor 28 is decreased, the sensitivity adjustment signal is decreased, thus causing the sensitivity adjustment circuit 12 to increase the sensitivity of the source microphone 11 relative to the device 13.

In operation, ambient noise is detected by the noise microphone 15. If an ultrasonic noise microphone 15 is used, as mentioned above, the sensed noise signal primarily represents the high frequency noise components, not the relatively low frequency components of the source input which is being directed to the source microphone 11. The signal from the noise microphone 15 is conditioned through the various components described above such that the signal present at the cathode of the diode 27 is a positive voltage which is proportional in magnitude to the ambient noise sensed by the noise microphone 15. Assuming that the capacitor 28 is initially discharged, the positive voltage present at the cathode of the diode 27 causes the capacitor 28 to slowly become charged. Such charging occurs because the diode 27 leaks a relatively small amount of current therethrough, even though it is reverse biased in this initial condition. This leakage current slowly charges the capacitor 28 such that the voltage at the anode of the diode 27 and the capacitor 28 becomes increasingly positive. Thus, the control voltage applied to the sensitivity adjustment circuit 12 slowly rises when the output from the noise microphone 15 rises, causing the sensitivity of the source microphone 11 relative to the device 13 to be slowly decreased.

However, if the voltage at the cathode of the diode 27 decreases below the voltage at the anode of the diode 27 (resulting from a decrease in the magnitude of the sensed noise), the capacitor 28 will discharge through the forward biased diode 27 and the resistor 25 to the voltage level on the capacitor 26 determined by the lower noise level. Therefore, the capacitor 28 is very rapidly discharged through the diode 27. Consequently, the sensitivity of the source microphone 11 relative to the device 13 is rapidly increased.

When the magnitude of the ambient noise sensed by the noise microphone 15 is constant, the capacitor 28 will be charged to a value, thus controlling the sensitivity of the source microphone 11 relative to the device 13 at a desired level. If the magnitude of such noise then increases, the capacitor 28 will be slowly charged as described above so as to slowly decrease the sensitivity of the source microphone 11 relative to the device 13. On the other hand, if the magnitude of such ambient noise decreases, the capacitor 28 will be rapidly discharged so as to rapidly increase the circuit sensitivity. It will be appreciated that since the capacitor 28 is discharged at a rate which is much faster than the rate at which it is charged, the circuit sensitivity is raised more quickly in response to a decrease in the magnitude of the ambient noise sensed by the noise microphone 15 than it is lowered in response to an increase in the magnitude of such noise. This is desirable to prevent loss of transmission by quickly increasing the circuit sensitivity when the ambient noise suddenly decreases.

The illustrated circuit 10 may be provided with two separate microphones, i.e., the source microphone 11 and the noise microphone 15. However, a single microphone may be employed instead of the two separate microphones. In such an instance, it may be desirable to provide a conventional filter to remove the low frequency components from that portion of the signal which is fed to the amplifier 16. The use of a single microphone may have an advantage over separate microphones, in that the sensitivity control will be responsive to ambient noise sensed by the same microphone which senses the source.

Figure 2:
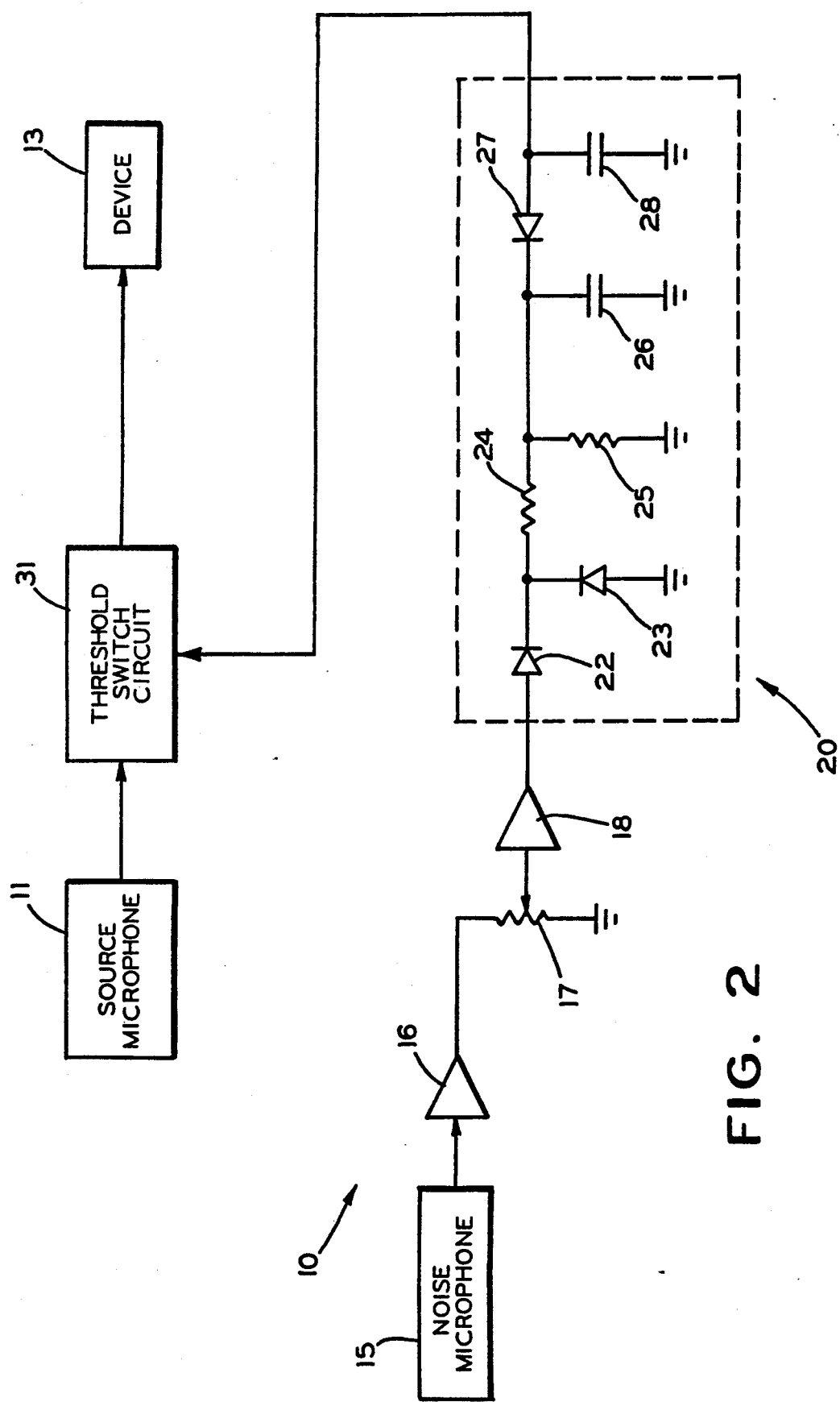
FIG. 2 is a schematic diagram illustrating an automatic microphone threshold control circuit in accordance with this invention.

Referring now to FIG. 2, there is illustrated a schematic diagram illustrating an automatic microphone threshold control circuit, indicated generally at 30, in accordance with this invention. The threshold control circuit 30 is similar to the sensitivity control circuit 10, and like reference numbers are used to indicate similar components. In FIG. 2, an electronic threshold switch 31 is provided in lieu of the sensitivity adjustment circuit 12. The switch 36 is conventional in the art and is responsive to the sensitivity control signal from the capacitor 28 for operating in either an opened mode or a closed mode. In the opened mode, the signal from the source microphone 11 is not passed through the switch 31 to the device 13. In the closed mode, the signal from the source microphone 11 is passed through the switch 31 to the device 13.

When the magnitude of ambient noise increases, the capacitor 28 will be slowly charged as described above, eventually crossing the threshold level and causing the switch 31 to be operated in the opened mode. On the other hand, when the magnitude of such ambient noise decreases, the capacitor 28 will be rapidly discharged to a lower charge level so as to rapidly cross the threshold level and cause the switch 31 to be operated in the closed mode.

In accordance with the provisions of the patent statutes, the principle and mode of operation of this invention have been explained and illustrated in its preferred embodiments. However, it must be understood that this invention may be practiced otherwise than as specifically explained and illustrated without departing from its spirit or scope.

What is claimed is:

1. An electronic circuit for automatically adjusting the sensitivity of a microphone relative to a device in accordance with changes in the magnitude of ambient noise comprising:
    means responsive to the ambient noise for generating a voltage representative thereof having only a first polarity;
    a capacitor;
    a diode having a cathode and an anode, said diode connecting said voltage generating means and said capacitor so as to be reversed biased with respect to said first polarity; and
    means connected to said capacitor for automatically adjusting the sensitivity of a microphone relative to the device in accordance with the voltage across said capacitor, whereby said capacitor is slowly charged by leakage current through said diode as the magnitude of ambient noise increases so as to slowly decrease the sensitivity.

2. The invention defined in claim 1 wherein said capacitor is also connected to ground potential.

3. The invention defined in claim 1 wherein said cathode of said diode is connected through a resistor to ground potential, whereby said capacitor is rapidly discharged through said diode and said resistor as the magnitude of the ambient noise increases so as to rapidly increase the sensitivity.

4. An electronic circuit for automatically controlling the operation of a threshold switch connected between a microphone and a device in accordance with changes in the magnitude of ambient noise, the threshold switch being selectively operable in an opened mode, wherein a signal from the microphone is not passed therethrough to the device, and in a closed mode, wherein the signal from the microphone is passed therethrough to the device, the circuit comprising:
    means responsive to the ambient noise for generating a voltage representative thereof having only a first polarity;
    a capacitor;
    a diode having a cathode and an anode, said diode connecting said voltage generating means and said capacitor so as to be reversed biased with respect to said first polarity; and
    means connected to said capacitor for automatically adjusting the sensitivity of a microphone relative to the device in accordance with the voltage across said capacitor, whereby said capacitor is slowly charged by leakage current through said diode as the magnitude of ambient noise increases so as to slowly approach and cross a threshold value to change the threshold switch from the closed mode to the opened mode.

5. The invention defined in claim 4 wherein said capacitor is also connected to ground potential.

6. The invention defined in claim 4 wherein said cathode of said diode is connected through a resistor to ground potential, whereby said capacitor is rapidly discharged through said diode and said resistor as the magnitude of the ambient noise increases so as to rapidly approach and cross the threshold value to change the threshold switch from the opened mode to the closed mode.

* * * * *